US008853647B2

(12) United States Patent
Ogashiwa et al.

(10) Patent No.: US 8,853,647 B2
(45) Date of Patent: Oct. 7, 2014

(54) ELECTRON MICROSCOPE

(75) Inventors: Takeshi Ogashiwa, Tokyo (JP); Masahiro Akatsu, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/130,919

(22) PCT Filed: May 16, 2012

(86) PCT No.: PCT/JP2012/003177
§ 371 (c)(1),
(2), (4) Date: Jan. 4, 2014

(87) PCT Pub. No.: WO2013/011612
PCT Pub. Date: Jan. 24, 2013

(65) Prior Publication Data
US 2014/0151555 A1  Jun. 5, 2014

(30) Foreign Application Priority Data
Jul. 19, 2011   (JP) .................................. 2011-157407

(51) Int. Cl.
G21K 5/10    (2006.01)
G21K 5/08    (2006.01)
H01J 37/26   (2006.01)
H01J 37/28   (2006.01)

(52) U.S. Cl.
CPC ...................................... *H01J 37/28* (2013.01)
USPC ....................... 250/440.11; 250/310; 250/311

(58) Field of Classification Search
USPC .................... 250/306, 307, 310, 311, 440.11, 250/441.11, 442.11
See application file for complete search history.

(56) References Cited

U.S. PATENT DOCUMENTS

| 5,254,857 | A  | * | 10/1993 | Ross et al. ..................... 250/310 |
| 7,381,968 | B2 | * | 6/2008  | Tanaka et al. ............. 250/440.11 |
| 7,812,310 | B2 | * | 10/2010 | Tanaka et al. ................. 250/311 |
| 8,455,823 | B2 | * | 6/2013  | Ichimura et al. .............. 250/310 |
| 2009/0230304 | A1 | * | 9/2009 | Hatano et al. ................. 250/311 |
| 2012/0145899 | A1 | * | 6/2012 | Matsumoto ................... 250/310 |
| 2012/0161000 | A1 | * | 6/2012 | Tateno .......................... 250/310 |

FOREIGN PATENT DOCUMENTS

JP    2005-327710 A    11/2005

* cited by examiner

*Primary Examiner* — Bernard E Souw
(74) *Attorney, Agent, or Firm* — Miles & Stockbridge P.C.

(57) ABSTRACT

Provided is an electron microscope on which a specimen holder to have high voltage applied is mountable. The specimen holder has safety (electric shock prevention) features, and attention is paid to the specimen holder in terms of operability. The microscope includes a specimen holder having a function of applying a voltage to a specimen mount disposed to load a specimen, a voltage source that supplies the voltage to be applied to the specimen mount, a voltage cable connected at one end thereof to the specimen holder, and a relay unit to which the other end of the voltage cable is connected, the relay unit being placed on a supporting base that supports a lens barrel of the electron microscope.

14 Claims, 6 Drawing Sheets

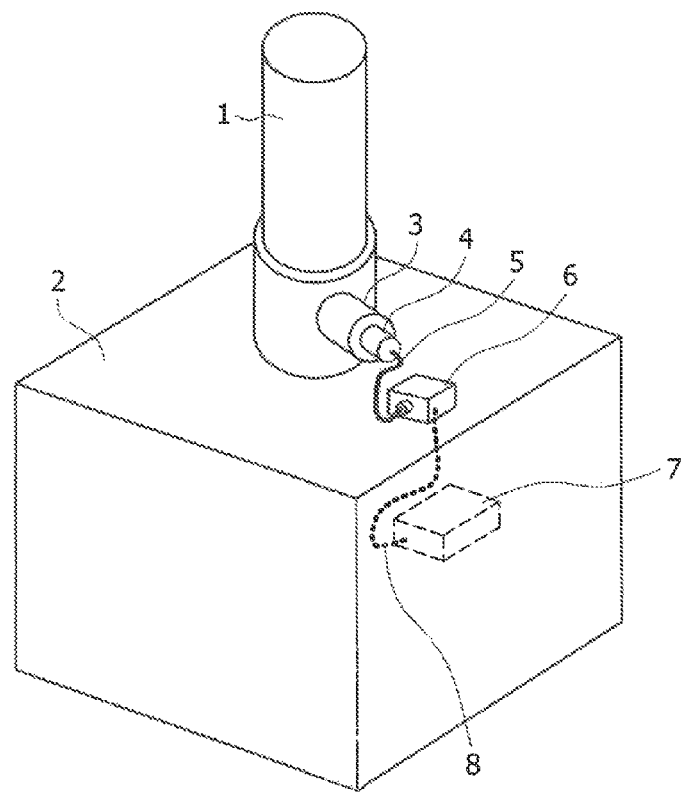
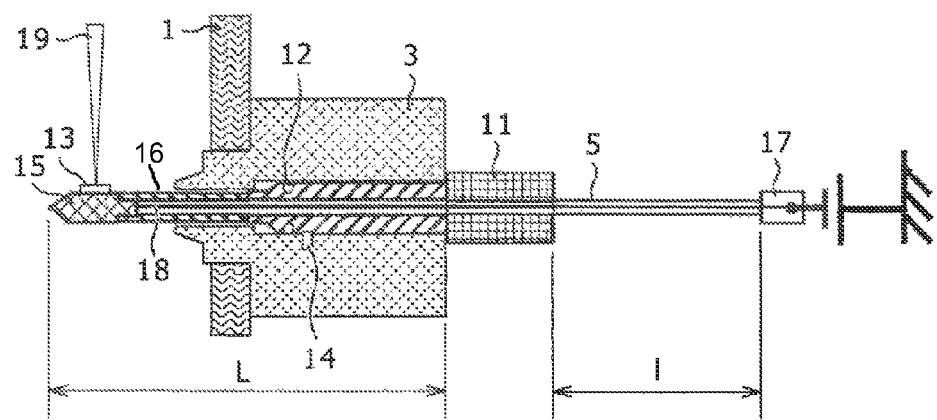

CIRCLE OF RADIUS L

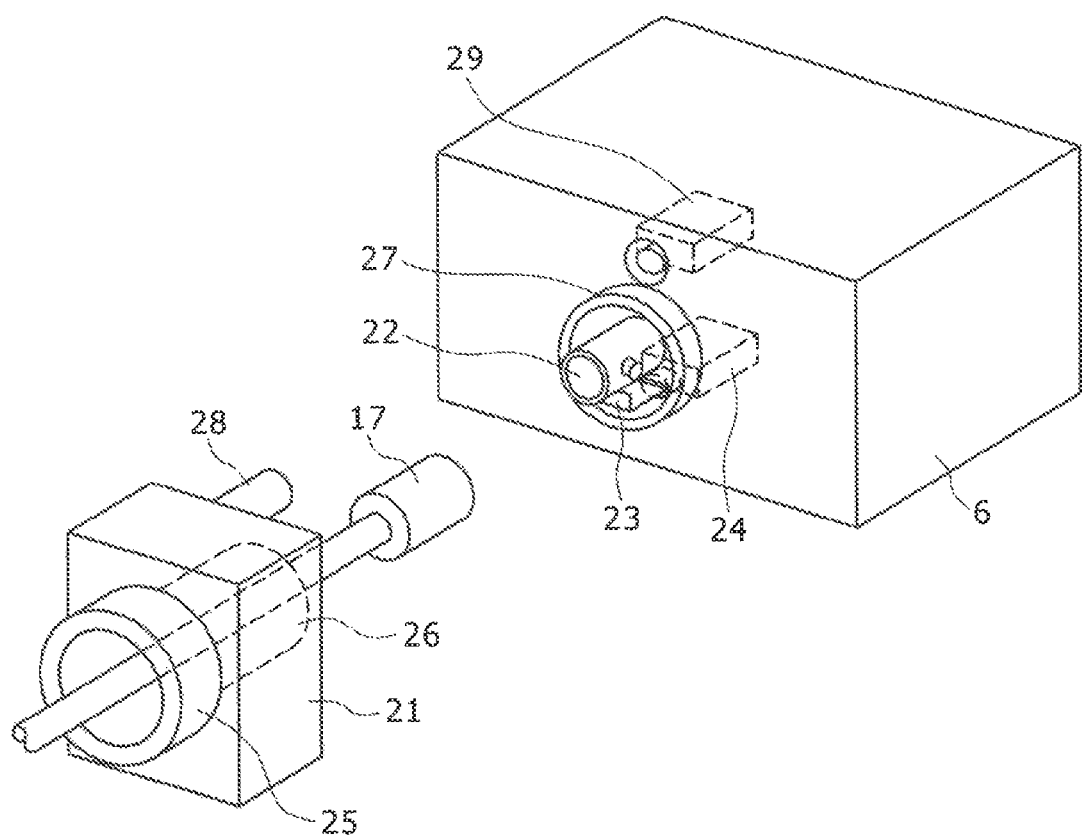
F I G . 4

FIG. 6
(a)
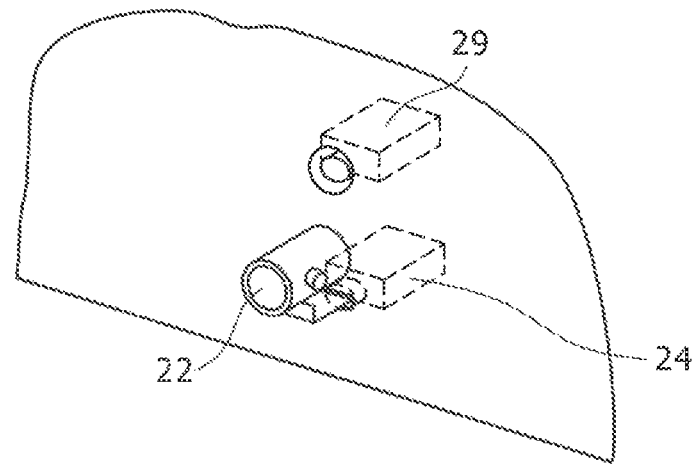
(b)
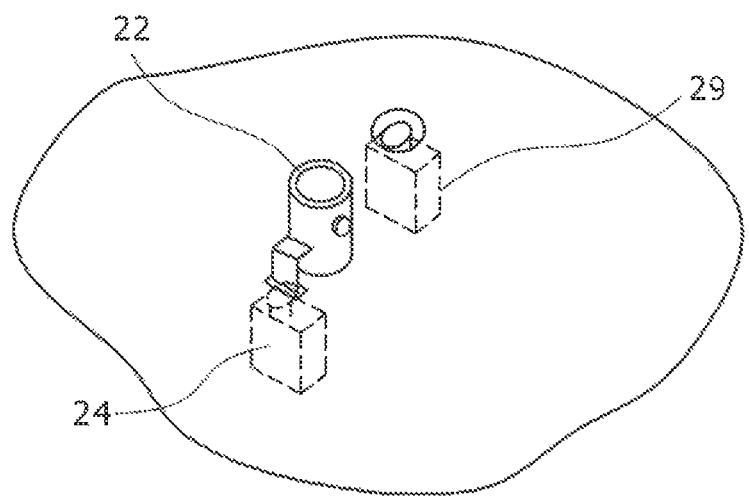

ELECTRON MICROSCOPE

TECHNICAL FIELD

The present invention relates generally to electron microscopes, and more particularly to an electron microscope including a system adapted to safely apply high voltage to a specimen.

BACKGROUND ART

An electron microscope uses electromagnetic lenses to focus on a specimen a primary electron beam emitted from an electron gun, then detect electrically charged secondary particles arising from the specimen, and acquire a magnified image of the specimen. A scanning electron microscope is an extended type of electron microscope with a function added to scan the primary electron beam across the specimen surface by use of electromagnetic or electrostatic deflectors placed above objective lenses.

In general imaging through a scanning electron microscope, a specimen is electrically grounded for its observation. Voltage may however be applied to the specimen to observe an image of the specimen. Recently, in particular, beam deceleration is coming to be most commonly used as a method of observing a specimen image. The deceleration method is a technique used to observe an image of a specimen by applying a negative voltage of nearly several hundreds of kilovolts to several kilovolts as a decelerating voltage to the specimen and decelerating a primary electron beam immediately in front of the specimen.

In the deceleration method, if an accelerating voltage applied from an electron gun to accelerate the primary electron beam is expressed as Vacc, and the decelerating voltage applied to the specimen is expressed as Vr, an irradiation voltage (also referred to as landing energy) Vi obtained when the primary electron beam reaches the specimen is expressed as Vi=Vacc−Vr. When the deceleration method is used, high image quality can be obtained as compared with that obtained when the deceleration method is not used (i.e., when the specimen is electrically grounded), even with the same irradiation. For example, although the irradiation voltage obtained at Vacc=1 kV and Vr=0.5 kV is the same as that obtained at Vacc=0.5 kV and Vr=0.0 kV, the former improves optical resolution meaning how clearly or sharply details of the specimen are imaged over the latter. In addition, the use of deceleration means enables the specimen image to be observed at a lower irradiation voltage (say, Vi=0.1 kV) than a minimum accelerating voltage (say, Vacc=0.5 kV) realizable with the electron gun. Thus, topographic observation of the uppermost surface of the specimen can be realized at high resolution. The observation with the deceleration method provides a variety of other advantages such as suppressing the build-up of electric charges in the specimen and reducing damage to the specimen.

Scanning electron microscopes can be classified into an out-lens type, a semi-in-lens type, and an in-lens type according to a particular layout relationship between objective lenses and a specimen. In the out-lens type of scanning electron microscope, the specimen is placed at a position completely distant from magnetic fields of the objective lenses, and in the in-lens type, the specimen is placed within the magnetic fields of the objective lenses. In the semi-in-lens type, which is somewhere between the out-lens type and the in-lens type, the specimen is placed at a location where the magnetic fields of the objective lenses partially leak. Of the three types of scanning electron microscopes, the in-lens type of scanning electron microscope capable of utilizing optical power of the objective lenses most efficiently is the most advantageous in that high-resolution images can be acquired.

In the in-lens type of scanning electron microscope that uses objective lenses (hereinafter, this microscope is referred to simply as in-lens SEM), a specimen needs to be placed between magnetic poles of the lenses in order to locate the specimen within the magnetic fields of the lenses. The specimen is therefore loaded into a position at an end of a special specimen holder and then inserted between the objective lenses to observe a magnified image of the specimen.

However, the deceleration method, an observation technique that involves applying a voltage of the same level (the same order of magnitude) as that of the accelerating voltage upon the primary electron beam, has the nature that the specimen needs to be loaded into position at the end of the special specimen holder and then inserted between magnetic poles of the objective lenses. This is likely to cause discharge and problems associated with safety. For this reason, the deceleration method has not been applied to in-lens SEM in the past.

On the other hand, techniques in which for other purposes a voltage, although not as high as the accelerating voltage, is applied to a specimen holder traditionally exist, primarily in the fields of transmission electron microscopes or scanning transmission electron microscopes. For example, Patent Document 1 below discloses an electron microscope in which, on a specimen holder with a plurality of specimens mounted thereupon, a memory is also mounted on the specimen holder to discriminate each of the specimens and an external power supply serving as a driving power supply for the memory is connected to the specimen holder via a cable.

According to Patent Document 1, a cable connection sensor that determines whether the cable is connected is disposed on a high-voltage lead-in connector as a measure to ensure safety associated with the application of the voltage. Thus, the application of the voltage to the specimen holder is inhibited if the cable connection sensor does not detect the connected state of the cable, or if a main body of the electron microscope fails to recognize the memory on the specimen holder.

PRIOR ART LITERATURE

Patent Document

Patent Document 1: JP-2005-327710-A (U.S. Pat. No. 7,381,968)

SUMMARY OF THE INVENTION

Problems to be Solved by the Invention

To apply the deceleration method to in-lens SEM, it is absolutely necessary, because of the observation scheme where the specimen holder needs to be inserted between the objective lenses, to connect the high-voltage cable to the specimen holder and apply a decelerating voltage to the holder. A power supply for a scanning electron microscope is commonly stored into a mounting base or disposed as a power supply unit independent of the microscope main body. The in-lens SEM employing the deceleration method, therefore, has no other choice but to connect the long high-voltage cable by routing it from the inside of the mounting base or the independent unit to the specimen holder.

In such in-lens SEM, on the other hand, because the specimen holder is removable from the SEM main body even during an observation, if the long high-voltage cable is connected to the specimen holder, the cable is likely to be entangled around the apparatus operator's body and cause the specimen holder to be inadvertently pulled out from the SEM main body during operations.

The removal of the specimen holder with the high voltage applied could lead to a risk of electric shock to the operator or to damage to the apparatus due to a discharge inside the electron optical lens barrel.

Patent Document 1 discusses problems relating to the connected state of the specimen holder (connector) and cable under an unenergized condition but does not recognize the issue of safety of the apparatus under operation as a matter. When the deceleration method is executed in the in-lens SEM, however, since a voltage much higher than in conventional electron microscopy is applied to the specimen holder, safety for the operator needs to be reviewed with more scrupulous care than in conventional electron microscopy.

An object of the present invention is to provide an electron microscope in which the apparatus can be operated more safely than conventional scanning electron microscopes even during operation of the apparatus when the deceleration method is adopted in the scanning electron microscope whose specimen holder is inserted into an electron optical lens barrel for specimen surface observation.

Means for Solving the Problems

In order to solve the above-described problems, an electron microscope according to an aspect of the present invention includes a specimen holder having a function of applying a voltage to a specimen mount disposed to load a specimen, a voltage source that supplies the voltage applied to the specimen mount, a voltage cable connected at one end thereof to the specimen holder, and a relay unit to which the other end of the voltage cable is connected, the relay unit being placed either on a supporting base that supports a lens barrel of the electron microscope or inside a cover.

In this case, length of the voltage cable is desirably smaller than that of the specimen holder. Therefore, if the relay unit is placed inside a circle whose radius starting from an end portion of the specimen holder as inserted into the electron optical lens barrel is smaller than the length of the specimen holder, then the length of the voltage cable can be made smaller than that of the specimen holder.

Effect of the Invention

Accordingly, the relay unit is placed either on the supporting base or in the cover, which makes it unnecessary to route the high-voltage cable from a power supply and hence reduces a risk of the specimen holder to be inadvertently pulled out from the microscope during operation of the apparatus.

In addition, setting the length of the voltage cable smaller than that of the specimen holder enables the specimen holder to be prevented from being inserted into the electron optical lens barrel with a decelerating voltage applied.

As outlined above, according to the present invention, a scanning electron microscope is provided that is less liable than conventional ones to cause an electrical shock in a case that the deceleration method is adopted in the electron microscope whose specimen holder is inserted into an electron optical lens barrel for specimen surface observation.

BRIEF DESCRIPTION OF THE DRAWINGS

FIG. 1 is an overall external view of an electron microscope according to a first embodiment.

FIG. 2A is an explanatory diagram showing a specimen holder and specimen stage of the first embodiment.

FIG. 4 is a perspective view showing an electrical interconnection structure inside the relay unit according to the example shown in FIG. 3B.

FIG. 6 is an explanatory diagram showing placement of a relay unit in the second embodiment.

MODE FOR CARRYING OUT THE INVENTION

First Embodiment

Figure 2B:
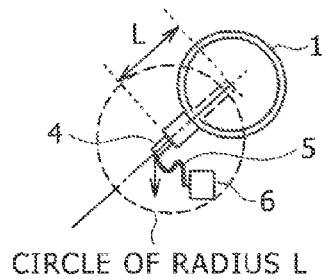
FIG. 2B is a top view showing a position of a relay unit under an inserted state of the specimen holder in the first embodiment.

Embodiments of the present invention will be described in detail with reference to the accompanying drawings. An exemplary configuration of an electron microscope including a side-entry specimen holder will be set forth in the description of the embodiments.

FIG. 1 is a schematic view of a first embodiment of the present invention, showing an electron microscope constructed to load a specimen on a specimen mount at an end of the specimen holder and capable of applying a voltage to the specimen mount via the specimen holder.

An electron optical lens barrel 1 that irradiates the specimen with a primary electron beam and after detecting electrically charged secondary particles obtained by the irradiation of the primary electron beam outputs a corresponding image signal is supported by an upper surface of a supporting base 2. A specimen stage 3 for moving the specimen is mounted on the electron optical lens barrel 1, and the specimen holder 4 for applying high voltage with the specimen mounted on the specimen holder 4 is inserted into the specimen stage 3.

A high-voltage source 7 for supplying the voltage to be applied to the specimen is disposed inside the supporting base so that an operator cannot directly touch the high-voltage source 7.

The voltage generated by the high-voltage source 7 is first introduced into a relay unit 6 placed on the supporting base 2 via a voltage cable 8 extending from the high-voltage source 7. The voltage is further introduced from the relay unit 6 into the specimen holder 4 via a voltage cable 5 and applied to the specimen on the specimen mount. The relay unit 6 includes a connection terminal for accepting the voltage cable 5, and when the specimen is observed using the deceleration method, the voltage cable 5 is connected to the relay unit 6.

FIG. 2A shows the way the specimen holder 4 is inserted in the specimen stage 3. The specimen holder 4 is mounted in the side-entry specimen stage 3 inserted from a side of the electron optical lens barrel 1 via a vacuum feedthrough into the electron optical lens barrel. The specimen holder 4 includes a grip 11, an O-ring 12 to allow insertion into the electron optical lens barrel 1 placed under a high-vacuum state, a guide pin 14 for guiding a direction in which the specimen holder 4 is inserted, the specimen mount 15 for mounting the specimen 13 thereupon, and a shaft 16 for insulating the specimen mount 15 from other portions of the specimen holder 4 and the electron optical lens barrel 1.

The voltage cable 5 extends from the grip 11, and a BNC connector A (male terminal) 17 for connection to the relay unit 6 is disposed at one end of the cable. High voltage applied from the BNC connector A 17 is supplied to the specimen mount 15 through a voltage lead wire 18 routed inside the holder including the grip, and then the high voltage acts as a decelerating voltage towards the primary electron beam 19. Here, as shown in FIG. 2A, length L of the specimen holder body 4 from an end face of the grip 11 to an end face of the specimen mount 15 is greater than length "l" of the voltage cable 5, that is, a relationship of "L>l" exists between the two dimensions.

When the length L of the specimen holder body 4 and the length "l" of the voltage cable 5 satisfy the relationship of "L>l" as described above, mounting the specimen holder 4 in the specimen stage 3 requires mounting the specimen holder 4 before connecting the voltage cable 5 to the relay unit 6. This is because, since the length of the voltage cable 5 is smaller than that of the specimen holder body, if the connection of the voltage cable 5 to the relay unit 6 precedes, the specimen holder 4 cannot be mounted in the specimen stage 3.

In order for L and "l" to satisfy the relationship of "L>l", layout of the relay unit 6 on the supporting base needs an appropriate measure. FIG. 2B shows a top view of the electron microscope with the specimen holder 4 inserted into the position. As shown, the specimen holder 4 is placed with one end reaching a substantially central portion of the electron optical lens barrel 1, and with the other end, or the connection between the grip 11 and the voltage cable 5, protruding outward from the electron optical lens barrel 1 by length of the grip 11. The relationship of "L>l" is satisfied if the relay unit 6 (more strictly, the terminal for connection to the cable) is positioned on the supporting base so as to be inside the circle of the radius L that has a center at a point of projection of the above protruding position as projected on the supporting base.

In practice, the voltage cable 5 needs to have a certain degree of slack. To satisfy the relationship of "L>l", therefore, it is necessary to place the relay unit 6 close to a substantial extent to the electron optical lens barrel 1.

Next, details of the relay unit 6 are described below using FIGS. 3 and 4.

Figure 3A:
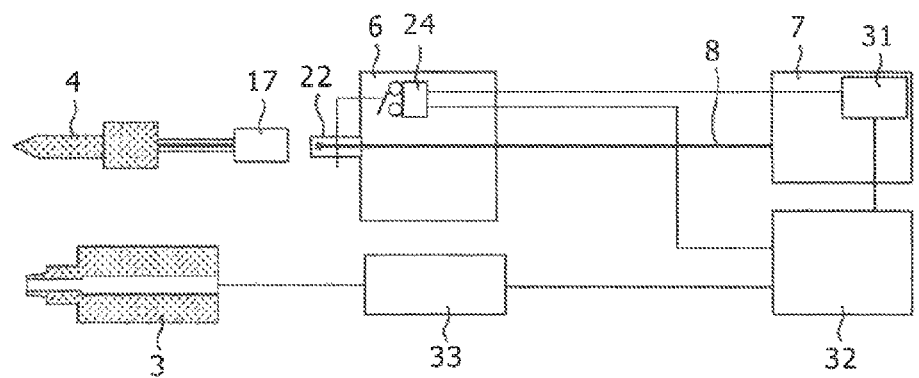
FIG. 3A is an explanatory diagram showing an example of relay unit periphery of the first embodiment in detail.

FIG. 3A is an explanatory diagram showing an example of relay unit periphery of the first embodiment in detail. FIG. 3A shows, particularly, an electrical wiring between electrical interconnects inside the relay unit 6 and the specimen holder 4. The relay unit 6 includes a connector mounting detection switch 24, and the high-voltage source 7 inside the supporting base includes a power supply 31. The power supply 31 is an electric power supply device for generating high voltage. The high-voltage source 7 is a high-voltage supply device that generates high voltage based on a supply of voltage from the power supply 31, and the high-voltage source 7 may be disposed integrally with or separately from the power supply 31.

Electrical continuity between the specimen holder 4 and the high-voltage source 7 is controlled by high-voltage control means 32 operating as a high-voltage control unit.

The connector mounting detection switch 24 as a connector detector operates synchronously with the power supply 31 of the high-voltage source 7. When the connector mounting detection switch 24 is activated (mounting is not detected), the high-voltage control means 32 interrupts the electrical continuity between the power supply 31 of the high-voltage source 7 and the BNC connector, or the specimen holder 4.

The high-voltage control means 32 also operates synchronously with vacuum-monitoring means 33 that monitors a vacuum state of the specimen stage 3 to interrupt the electrical continuity between the power supply 31 of the high-voltage source 7 and the specimen holder 4 when a degree of vacuum does not reach a threshold. This prevents the decelerating voltage from being applied when an insertion path of the specimen holder 4 or the electron optical lens barrel 1 is internally under an insufficient degree of vacuum, therefore resulting in avoiding a discharge-associated accident.

The connector mounting detection switch 24 may operate synchronously with the high-voltage control means 32.

Even if the voltage cable 5 is connected to the relay unit 6 before the mounting of the specimen holder 4, the vacuum-monitoring means 33 electrically interrupts the high-voltage control means 32 since the specimen holder 4 is not mounted in the specimen stage 3. In contrast to this, when the specimen holder 4 is to be removed from the specimen stage 3, there is a need to disconnect the voltage cable 5 from the relay unit 6 in advance. This prevents the specimen holder 4 from being removed from the specimen stage 3 with the high voltage applied to the specimen holder 4.

As described above, under the configuration shown in FIG. 3A, when the voltage cable 5 is not appropriately connected to the relay unit 6, the decelerating voltage is not applied to the cable connection terminal of the relay unit 6, which then prevents occurrence of an electric shock accident due to a connection failure between the relay unit 6 and the voltage cable 5.

Figure 3B:
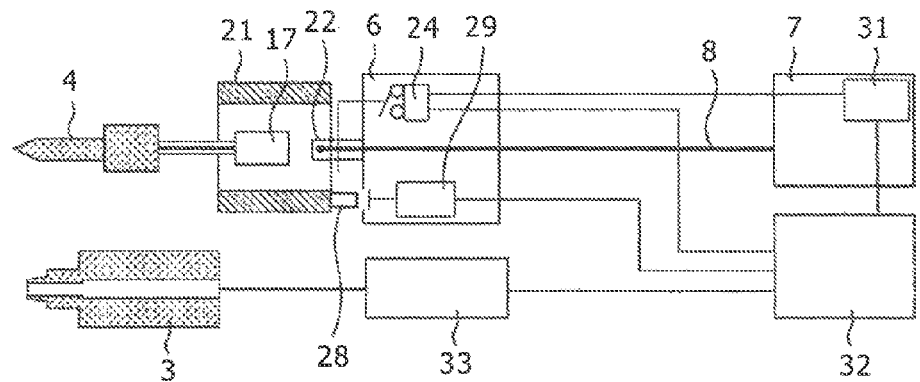
FIG. 3B is an explanatory diagram showing another example of relay unit periphery of the first embodiment in detail.

FIG. 3B is an explanatory diagram showing another example of relay unit periphery of the first embodiment in detail, and FIG. 4 is a perspective view showing an electrical interconnection structure inside the relay unit according to the example of details shown in FIG. 3B.

FIGS. 3B and 4 show exemplary configurations of the relay unit including a high-voltage safeguard to further enhance safety. First, appearance of the exemplary configurations is described below.

FIG. 4 is a perspective view of the relay unit with the high-voltage safeguard. The BNC connector A 17 on the voltage cable 5 connects to a BNC connector B (female terminal) 22 of the relay unit 6 via a hole in the high-voltage safeguard 21. A knob 25 disposed on the high-voltage safeguard 21 has a front end serving as a front-end screw 26, and rotation of the knob 25 enables the front-end screw 26 to interlock directly with a screw 27 of the relay unit 6, thereby fixing the high-voltage safeguard 21 to the relay unit 6.

When the BNC connector A 17 is fitted to (connected to) the BNC connector B 22, a switch plate 23 is pushed to activate the connector mounting detection switch 24. In addition, when the front-end screw 26 is loaded to the screw 27, a pin 28 on the high-voltage safeguard 21 is inserted into a hole formed directly above the screw 27, hence activating a high-voltage safeguard mounting detection switch 29 that serves as a second switch of the relay unit 6.

FIG. 3B shows electrical wiring between the electrical interconnects inside the relay unit 6 and the specimen holder 4. The high-voltage safeguard mounting detection switch 29 operates synchronously with the high-voltage control means 32 controlling the states of the high-voltage source 7 and other high-voltage sections. When the high-voltage safeguard mounting detection switch 29 is activated (mounting of the high-voltage safeguard is not detected), electrical continuity between the power supply 31 of the high-voltage source 7 and the relevant BNC connector is interrupted by the high-voltage control means 32.

Under the configurations shown in FIGS. 3B and 4, it is necessary for the connector mounting detection switch 24 and the high-voltage safeguard mounting detection switch 29 to detect the mounting of the respective relevant sections, and for the vacuum-monitoring means 33 to detect that the specimen holder 4 is inserted in the specimen stage 3 and that a vacuum is drawn in to a certain level. At this time, the power supply 31 of the high-voltage source 7 and the high-voltage control means 32 operate to output a desired high voltage from the high-voltage source 7. After the output high voltage reaches the BNC connector A 17 via the voltage cable 8, the high voltage is introduced into the specimen holder 4.

A case in which the BNC connector A 17 of the voltage cable 5 extending from the specimen holder 4 is disconnected from the relay unit 6 with the high voltage applied to the specimen holder 4 is next described below. Before the BNC connector A 17 is disconnected, it is necessary that the high-voltage safeguard 21 be removed from the relay unit 6. Without the high-voltage safeguard 21 being mounted, the high-voltage control means 32 turns off the high voltage. The high-voltage safeguard 21 is fixed using screws and requires a certain amount of time for removal. Accordingly, the electric potential stored in the specimen holder 4 is also removed within the screw removal time. In this state, potential hazards of contact with a high-voltage section during the disconnection of the BNC connector A 17 can be reduced.

As described above, the high voltage can be cut off by disconnecting the connector A 17 even with the high voltage applied to the specimen holder 4 under the configuration of FIG. 3A. In this case, the electric charge stored in the specimen holder 4 might cause electrical shock due to discharge to the operator's body region such as a hand. The configuration of FIG. 3B, on the other hand, can cut off the high voltage by removing the high-voltage safeguard 21 before disconnecting the connector A 17. This high-voltage cutoff enables the charge to be removed from the specimen holder 4, and hence, electrical shock to be prevented. Briefly, after the removal of the high-voltage safeguard 21 blocks the high voltage, a time lag from the cutoff to the disconnection of the connector A 17 removes the charge in the specimen holder 4, consequently preventing the electric shock.

With the above configuration, contact with a high-voltage section can be avoided when the specimen holder 4 is mounted in and removed from the specimen stage 3. Even in such form of specimen holder 4 as will entail or involve the operator's direct touch, therefore, a safe system for applying high voltage to the specimen mount 15 can be provided.

Although an example of an electrical connection diagram relating to the relay unit 6 has been shown in FIGS. 3A and 3B, elements with which the connector mounting detection switch and the high-voltage safeguard mounting detection switch operate synchronously may be the same and are not limited to the example. Although the switch structures and parts of the relay unit 6 have been shown in FIG. 4, the switches are not limited to mechanical types of switches and may be formed using magnetic sensors or optical switches.

Second Embodiment

Figure 5:
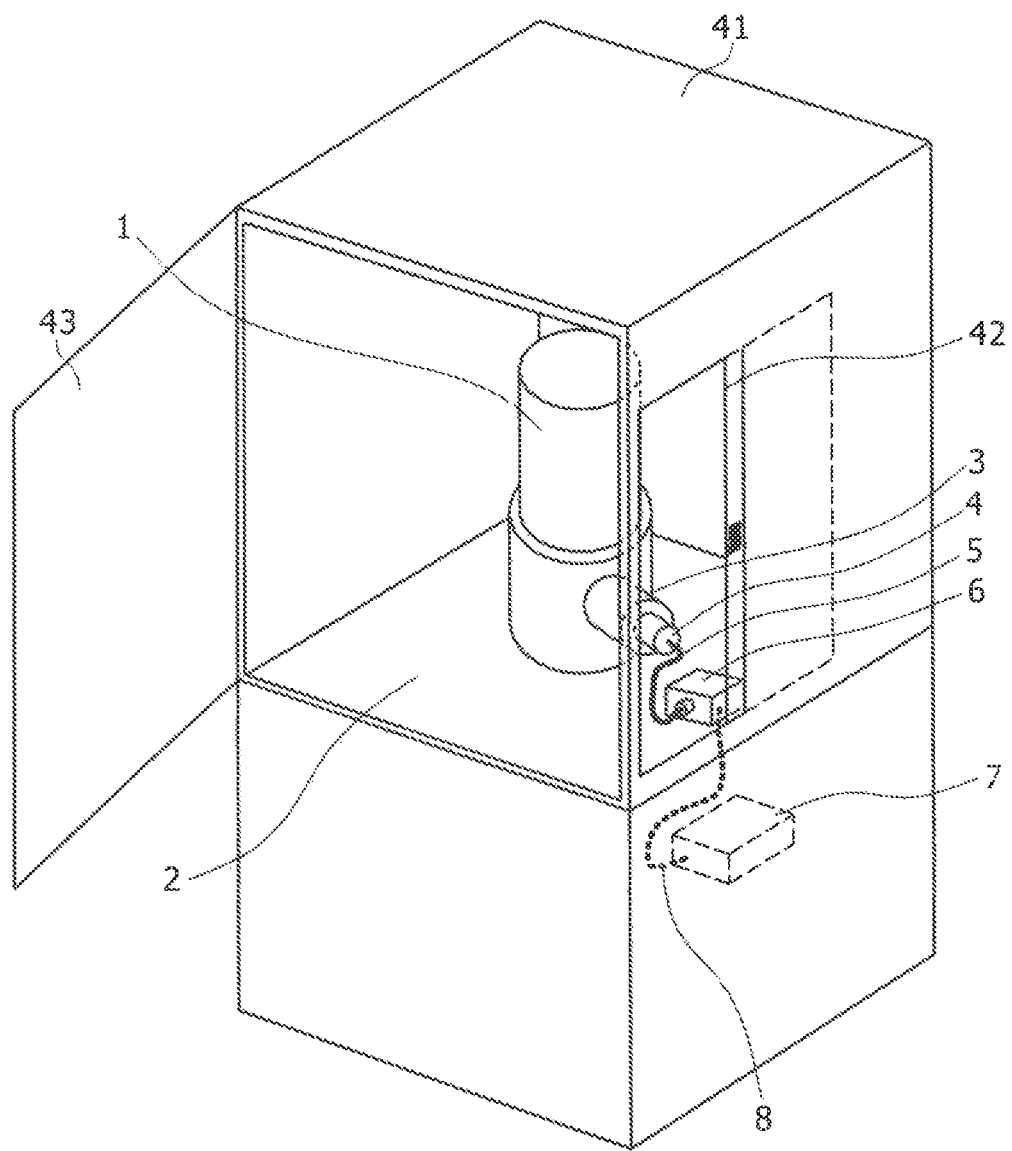
FIG. 5 is an overall external view of an electron microscope according to a second embodiment.

FIG. 5 is an overall external view of an electron microscope according to a second embodiment. In addition to functions equivalent to those of the electron microscope described in the first embodiment, the electron microscope of the second embodiment includes a cover 41 covering the electron optical lens barrel 1 and the supporting base 2.

In electron microscopes, a particular flow of air due to either ambient noise or air conditioning may oscillate the primary electron beam, causing a noise signal to appear in the specimen image. Alternatively, expansion/contraction of the electron optical lens barrel or stage due to a change in the ambient air temperature may cause a drift (image deletion) of the specimen image. These phenomena occur more significantly during the acquisition of higher-magnification images. Providing the cover 41 as shown in FIG. 5 suppresses a change in the flow of air due to noise or air conditioning and a change in air temperature, and is thus effective for removing adverse effects of these changes. Placement of the cover is therefore suitable for beam deceleration with the deceleration method often used to acquire high-magnification images.

The cover 41 in the present embodiment includes a first door 42 used to remove the specimen holder 4 from the specimen stage 3, and a second door 43 used to access the electron optical lens barrel 1 from a front surface thereof for maintenance such as mechanical adjustment of the electron optical axis. The relay unit 6 is placed inside the cover 41 and suitably on the supporting base 2 near the first door 42. The opening of the first door 42 allows connector mounting and other operations. The voltage supply cable 5 extending from the specimen holder 4 is connected to the BNC connector B 22 of the relay unit 6. The relay unit 6 is suitably placed on the supporting base 2 in such a manner that a mounting surface of the BNC connector B 22 is parallel to that of the first door 42 or second door 43 in the cover 41 (i.e., to an open surface of the door when opened) to improve working efficiency in connector mounting/dismounting and other operations. In the example of FIG. 5, the relay unit 6 is disposed for the mounting surface of the BNC connector B 22 to face the second door 43 and is set at a position near the first door 42 so that the connector is easily accessible from the first door 42 and can be easily connected to and removed from the relay unit 6. While the relay unit 6 in FIG. 5 is box-shaped, the relay unit 6 may be buried in a wall formed inside the cover 41, as in the examples that FIG. 6 shows. Additionally, while the BNC connector B 22 in FIG. 6 (*a*) faces in the same direction as that of the BNC connector B 22 shown in FIG. 5, the BNC connector B 22 may face an upper surface of the relay unit 6 as in FIG. 6 (*b*).

Third Embodiment

An example of an in-lens SEM configuration in a third embodiment will be described.

Figure 7:
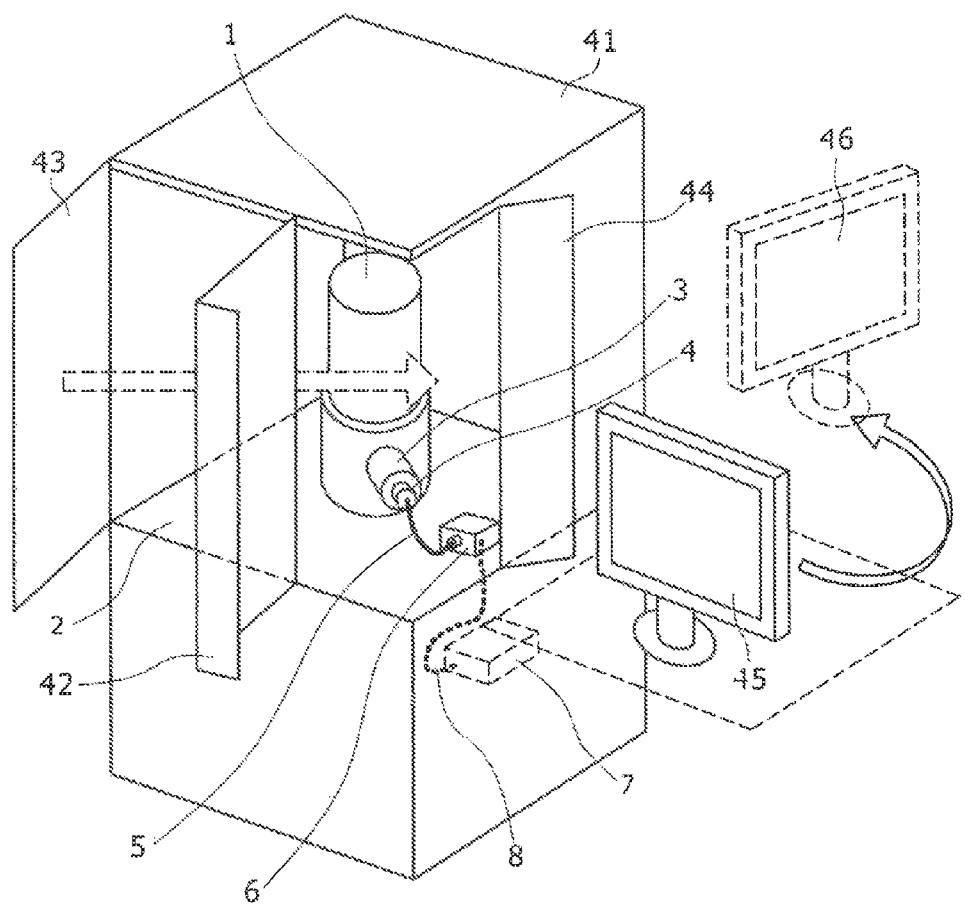
FIG. 7 is an overall external view of an electron microscope according to a third embodiment.

FIG. 7 is an overall external view of an electron microscope according to the present embodiment. In addition to functions equivalent to those of the electron microscope described in the first embodiment, the electron microscope of the third embodiment includes a cover 41 covering the electron optical lens barrel 1 and the supporting base 2.

The cover 41 includes a first door 42 used to remove the specimen holder 4 from the specimen stage 3, and a second door 43 used to access the electron optical lens barrel 1 from a front surface thereof for maintenance such as mechanical adjustment of the electron optical axis. The cover 41 further includes a third door 44 to facilitate confirmation of an operation screen 45 during the maintenance from the second door 43. When a display unit having the operation screen 45 is used, the display unit is mounted on a table shown with a dotted line in FIG. 7, and a direction of the screen can be suitably changed as shown in the figure. Upon opening the third door 44, therefore, an operator can visually confirm the operation screen when he or she accesses the SEM body via the second door 43 as shown with an arrow in FIG. 7.

The relay unit 6 is set on the supporting base 2 near the first door 42, and for example, the connector is connected to the relay unit.

Figure 8:
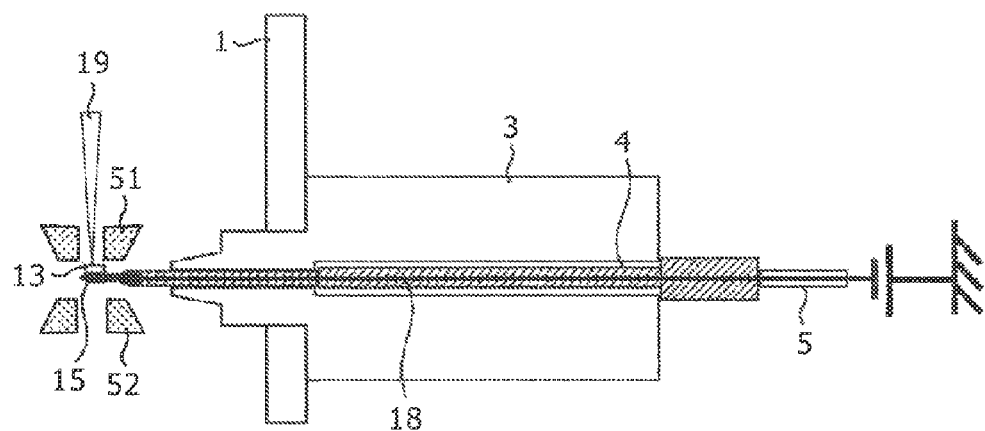
FIG. 8 is a diagram that shows relative positions between a specimen holder and objective lenses in the electron microscope of the third embodiment.

FIG. 8 shows relative positions between the specimen holder and objective lenses in the electron microscope as inserted in the electron optical lens barrel 1 of the third embodiment. The objective lenses with pole pieces are provided in the electron optical lens barrel 1. The pole pieces each include an upper magnetic pole 51 and a lower magnetic pole 52. In addition, the specimen stage 3 is disposed on a side face of the electron optical lens barrel 1, and the specimen holder 4 with the specimen 13 loaded into position on the holder is mounted between the upper magnetic pole 51 and lower magnetic pole 52 of each objective lens. The in-lens SEM can thus realize strong excitation under a short-focus state and is therefore suitable for high-resolution observation of specimen images. The high voltage that the high-voltage source 7 has generated in this state is supplied to the specimen mount 15 via the voltage cable 5 by the voltage lead wire 18 inside the specimen holder 4 and acts upon the primary electron beam 19.

In this way, the electron microscope described in any one of the examples in FIGS. 5 to 7 enables high-resolution observation with the deceleration method to be realized at a low irradiation voltage both safely and with ease of use. Additionally, the combination with the in-lens SEM, as in the example of FIG. 8, enables ultrahigh-resolution observation with the deceleration method to be realized at a low irradiation voltage.

DESCRIPTION OF REFERENCE NUMERALS

1 Electron optical lens barrel
2 Supporting base
3 Side-entry specimen stage (Specimen stage)
4 Specimen holder
5 Voltage cable (Voltage supply cable)
6 Relay unit
7 High-voltage source
8 Voltage cable
11 Grip
12 O-ring
13 Specimen
14 Guide pin
15 Specimen mount
16 Shaft
17 Connector A (BNC connector A)
18 High-voltage lead wire
19 Primary electron beam
21 High-voltage safeguard
22 BNC connector B
23 Switch plate
24 Connector mounting detection switch
25 Knob
26 Front-end screw (Front-end screw of knob)
27 Screw
28 Pin
29 High-voltage safeguard mounting detection switch
31 Power supply
32 High-voltage control means (High-voltage control unit)
33 Vacuum-mounting means
41 Cover
42 First door
43 Second door
44 Third door
45 Operation screen
51 Upper magnetic pole
52 Lower magnetic pole

The invention claimed is:

1. An electron microscope comprising:
an electron optical lens barrel that irradiates a specimen with a primary electron beam, detects secondary charged particles obtained by the irradiation of the primary electron beam, and outputs an image signal based on detection results of the secondary charged particles;
a supporting base that supports the electron optical lens barrel;
a specimen holder that includes a specimen mount to mount the specimen on the mount and has a function of applying a voltage to the specimen mount;
a voltage source that supplies the voltage applied to the specimen mount;
a voltage cable that is connected at one end thereof to the specimen holder; and
a relay unit to which the other end of the voltage cable is connected, the relay unit being placed on the supporting base.

2. The electron microscope according to claim 1, wherein length of the voltage cable is smaller than that of the specimen holder.

3. The electron microscope according to claim 1, wherein a terminal for connecting the voltage cable to the relay unit is disposed at the other end of the cable.

4. The electron microscope according to claim 1, wherein the relay unit includes a connection detector that detects the connection of the cable.

5. The electron microscope according to claim 1, wherein the relay unit includes a first switch for establishing and interrupting voltage supply from the specimen mount to the voltage source.

6. The electron microscope according to claim 5, wherein the relay unit includes a second switch that activates and deactivates the voltage source.

7. The electron microscope according to claim 6, wherein the relay unit includes a first BNC connector; and
the voltage cable includes a second BNC connector at an end portion of the cable, the end portion facing the relay unit when the cable is connected to the relay unit.

8. The electron microscope according to claim 7, wherein the first switch is disposed rearwardly of the BNC connector of the relay unit;
the second switch is disposed near the BNC connector of the relay unit; and
ring-shaped caps for fastening the BNC terminals of the relay unit and the voltage cable are disposed to enable the first switch and the second switch to be activated.

9. The electron microscope according to claim 1, further comprising:
a polyhedral cover that covers the electron optical lens barrel and the supporting base; and
a door disposed on a side face of the cover.

10. The electron microscope according to claim 9, further comprising:
a first door and a second door each disposed on a different face of the cover.

11. The electron microscope according to claim 9, wherein a connection surface provided on the relay unit so as to accept the voltage cable is a surface other than a rear face of the relay unit.

12. A scanning electron microscope comprising:
an electron optical lens barrel that scans a primary electron beam across a specimen surface, detects secondary charged particles obtained by the scan of the primary electron beam, and outputs an image signal based on detection results of the secondary charged particles;

a supporting base that supports the electron optical lens barrel;

a specimen holder that includes a specimen mount to mount the specimen on the mount, and has a function of applying a voltage to the specimen mount;

a voltage source that supplies the voltage applied to the specimen mount;

a voltage cable that is connected at one end thereof to the specimen holder; and a relay unit to which the other end of the voltage cable is connected, the relay unit being placed on the supporting base.

13. The scanning electron microscope according to claim 12, wherein the specimen holder is a side-entry stage that is inserted from a side face of the electron optical lens barrel via a vacuum feedthrough into a lens barrel.

14. The scanning electron microscope according to claim 12, wherein the electron optical lens barrel includes objective lenses of an in-lens type.

\* \* \* \* \*